United States Patent
Eklund et al.

(10) Patent No.: US 6,261,915 B1
(45) Date of Patent: *Jul. 17, 2001

(54) PROCESS OF MAKING POLYSILICON RESISTOR

(75) Inventors: Robert H. Eklund, Plano; Robert H. Havemann, Garland, both of TX (US); Leo Stroth, Wolfersdorf (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/247,910

(22) Filed: May 23, 1994

Related U.S. Application Data

(60) Continuation of application No. 08/060,189, filed on May 10, 1993, now abandoned, which is a division of application No. 08/014,890, filed on Feb. 8, 1993, now Pat. No. 5,465,005, which is a continuation of application No. 07/785,360, filed on Oct. 30, 1991, now Pat. No. 5,236,857.

(51) Int. Cl.[7] .................................. H01L 21/3213
(52) U.S. Cl. ............................................... 438/384
(58) Field of Search ..................... 437/47, 60, 918; 148/DIG. 136; 438/384, 385, FOR 429, FOR 220

(56) References Cited

U.S. PATENT DOCUMENTS

| 4,212,684 | * | 7/1980 | Brower . | |
|---|---|---|---|---|
| 4,377,819 | | 3/1983 | Sakai et al. | 357/59 |
| 4,418,468 | | 12/1983 | Vora et al. | 29/577 C |
| 4,455,547 | | 6/1984 | Murakami et al. | 257/538 |
| 4,455,567 | | 6/1984 | Lee et al. | 257/538 |
| 4,653,176 | | 3/1987 | Van Ommen | 29/578 |
| 4,734,382 | * | 3/1988 | Krishna . | |
| 4,948,747 | | 8/1990 | Pfiester | 257/538 |
| 4,949,153 | | 8/1990 | Hirao et al. | 357/51 |
| 5,013,678 | | 5/1991 | Winnerl | 437/52 |
| 5,236,857 | * | 8/1993 | Eklund et al. | 437/47 |
| 5,304,502 | * | 4/1994 | Hanagaski . | |

FOREIGN PATENT DOCUMENTS

| 0140488 | 10/1979 | (JP) . |
|---|---|---|
| 0079584 | 5/1984 | (JP) . |
| 0005537 | 1/1985 | (JP) . |
| 0239972 | 10/1988 | (JP) . |
| 0007550 | 1/1989 | (JP) . |

OTHER PUBLICATIONS

Chang et al., Bulk Resistors in Integrated Circuits, *IBM TDB*, vol. 12, No. 1, p. 19, Jun. 1969.

T. H. Ning, Polysilicon Resistor Process for Bipolar and MOS Applications, *IBM TDB*, vol. 23, No. 1, pp. 368–370, Jun. 1980.

C. G. Jambotkar, Method to Form Polysilicon Resistors Along with High–Performance Transistors, *IBM TDB*, vol. 23, No. 12, May 1981, pp. 5392–5395.

* cited by examiner

*Primary Examiner*—George Fourson
(74) *Attorney, Agent, or Firm*—Wade James Brady, III; Frederick J. Telecky, Jr.

(57) ABSTRACT

A method of forming an integrated circuit device including at least one polysilicon resistor 10 is disclosed herein. A polysilicon layer 24 is formed, possibly over a field oxide 12. The polysilicon layer 24 is then doped to achieve a selected sheet resistance. An insulating layer 18 (e.g., an oxide, a nitride, or a combination thereof) is then formed over the polysilicon layer 24. The insulating layer 18 is patterned and etched to define a resistor body 14 in the underlying polysilicon layer 24. The polysilicon layer 24 is then patterned and etched to define first and second resistor heads 16 abutting the resistor body 14 while simultaneously at least one polysilicon element 28 of a second electronic device is formed. Other systems and methods are also disclosed.

21 Claims, 3 Drawing Sheets

PROCESS OF MAKING POLYSILICON RESISTOR

This application is a continuation of application Ser. No. 08/060,189 filed May 10, 1993 (now abandoned), which is a division of 08/014,890 filed Feb. 8, 1993 now U.S. Pat. No. 5,465,005 (Issued Nov. 7, 1995), which is a continuation of 07/785,360 filed Oct. 30, 1991 now U.S. Pat. No. 5,236,857 (Issued Aug. 17, 1993).

FIELD OF THE INVENTION

This invention generally relates to the fabrication of semiconductor devices and specifically to a resistor structure and process.

BACKGROUND OF THE INVENTION

Electronic digital and analog integrated circuits often require resistors to perform the desired functions. One type of resistor is the diffused resistor wherein a region of a semiconductor layer is doped to the opposite polarity as the remainder of the layer. There are several disadvantages to using diffused resistors. In the diffused resistor there inherently is a capacitance at the interface of the resistor and the underlying semiconductor layer. This capacitance can lead to current leakage and slower device operation.

Another type of resistor which may be formed on an integrated circuit is a polysilicon resistor. Although some of the capacitance problems may be minimized with certain poly resistor structures, the devices are typically more difficult to build. Typically, two masking levels and possibly two layers of polysilicon are required to implement a poly resistor. This complex process adds additional cost and potential yield problems.

Accordingly, improvements which overcome any or all of the problems are presently desirable.

SUMMARY OF THE INVENTION

Other objects and advantages will be obvious, and will in part appear hereinafter and will be accomplished by the present invention which provides a method and structure for a resistor.

A method of forming an integrated circuit device including at least one polysilicon resistor is disclosed herein. A polysilicon layer is formed, possibly over a field oxide. The polysilicon layer is then doped to achieve a selected sheet resistance. An insulating layer (e.g., an oxide, a nitride or a combination thereof) is then formed over the polysilicon layer. The insulating layer is patterned and etched to define a resistor body in the underlying polysilicon layer. The polysilicon layer is then patterned and etched to define first and second resistor heads abutting the resistor body while simultaneously at least one polysilicon element of a second electronic device is formed.

An advantage of the invention is its simplicity since the poly resistor is formed using basically the same process steps as the remainder of the fabrication flow. The minimization of additional process steps will reduce production costs.

In addition, the process of the invention is simplified since the polysilicon resistor is isolated by the insulating layer on top and on the sidewalls if the resistor heads are to be silicided.

A further advantage is obtained if the resistor is formed over a field insulating region such as an oxide. With the oxide formed between the resistor and the substrate, the capacitance from the resistor to the substrate will be minimized.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of the structure and method of the present invention. The preferred embodiment will be described first followed by a description of the fabrication process.

Figure 1:
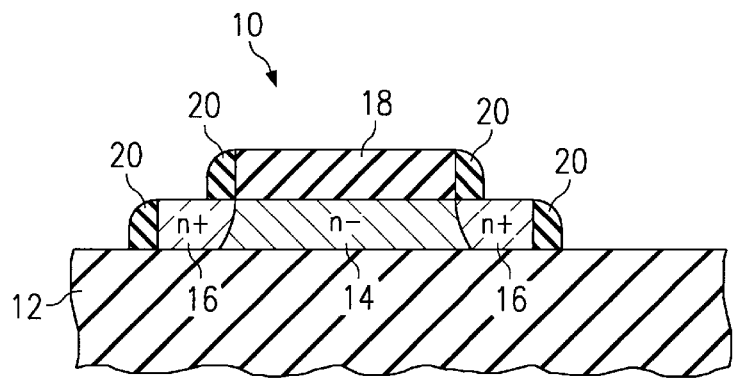
FIG. 1 is a cross-sectional view of a resistor built according to the present invention.

Referring first to FIG. 1, a first embodiment resistor 10 is illustrated. In the illustrated embodiment, the resistor 10 is formed on a field insulating region 12 which may typically comprise an oxide such as silicon dioxide.

The resistor includes a resistor body 14 and two resistor heads 16. In the illustrated embodiment, the resistor body 14 and resistor heads 16 comprises n-doped polycrystalline or amorphous silicon. Of course, p-type impurities may also be used to obtain the desired conductivity. The resistor may be doped with both n-type and p-type impurities. The resistor body 14 is lightly doped to achieve the desired sheet resistance for the particular application. The resistor heads 16, on the other hand, are typically more highly doped so to make good contact, i.e., very low electrical resistance, with the other components in the circuit.

Formed above resistor body 14 is insulating layer 18. The insulating layer 18 may comprise an oxide layer, a nitride layer or a combination thereof as examples. The insulating layer 18 defines the geometry of the resistor body 14.

Also illustrated in FIG. 1 are sidewall spacers 20. The sidewall spacers 20 may be formed from an oxide, a nitride or a combination thereof. Other elements, such as passivation, metalization, leads, and packaging, are not shown for clarity.

The resistor described herein may be used for any of the known integrated circuit technologies including, but not limited to, metal oxide semiconductor (MOS), complementary metal oxide semiconductor (CMOS), and bipolar. The resistor may especially be used in BiCMOS (combination of bipolar and CMOS devices on the same chip) circuits.

Figure 2:
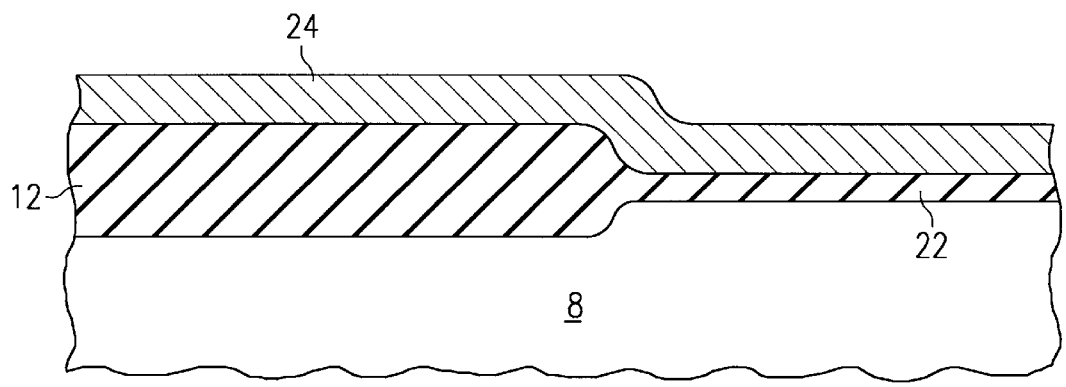
FIGS. 2, 3, 4a–4c and 5a–5c illustrate cross-sectional views of the device at various stages in the fabrication process.

A preferred embodiment fabrication process is illustrated in FIGS. 2 through 5. Referring first to FIG. 2, a field insulating region 12 and thin insulating layer 22 are formed on the surface of semiconductor substrate 8. The insulating region 12 and layer 22 may be formed using any known process such as thermally growing an oxide or depositing an oxide. These elements are optional and may be eliminated as desired.

In the first step of the preferred embodiment invention a polysilicon layer 24 is formed on the surface of substrate 8 such that a portion overlies field oxide 12. The polysilicon layer may be deposited to a thickness of between about 3000 and 5000 Å. The polysilicon layer 24 is then doped to achieve the desired resistor sheet resistance. The polysilicon layer 24 may be doped by ion implantation or diffusion subsequent to deposition or may be in situ doped. Either n-type or p-type impurities may be used. The doping step may include doping both n-type and p-type impurities. In addition, the polysilicon layer may be deposited as amorphous silicon and annealed to form polycrystalline silicon or if desired an amorphous silicon resistor may be fabricated.

Additionally, further processing may be formed on substrate 8 prior to forming polysilicon layer 24. For the purposes of this invention, however, these processing steps are unimportant.

Figure 3:
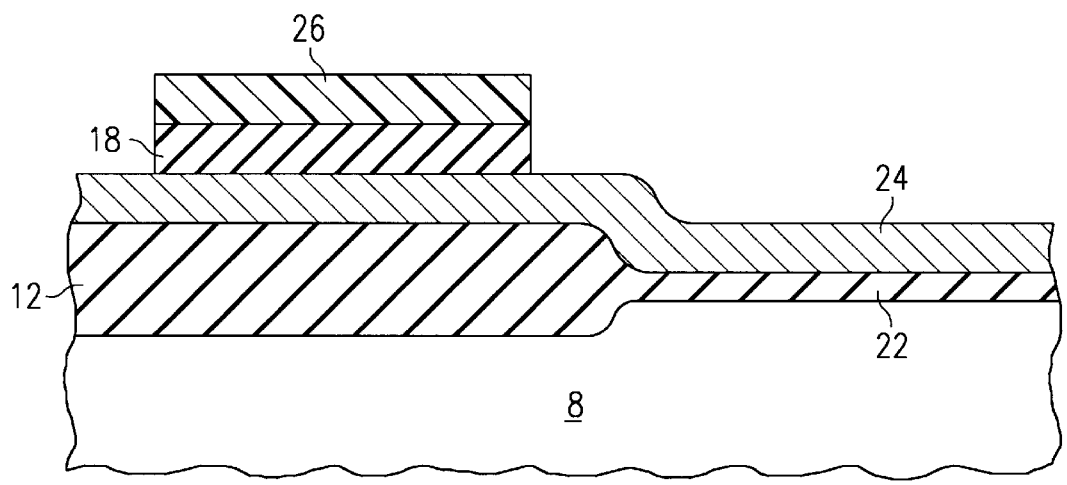

Referring next to FIG. 3, an insulating layer 18 is blanket deposited over the surface of polysilicon layer 24. The insulating layer 18 may comprise an oxide, a nitride or a combination thereof and it typically between 2500 and 5000 Å thick. It should be noted that the thickness of insulating layer 18 should be sufficient to block additional implants and not be totally removed during sidewall spacer formation (if sidewall spacers are desired). It may also be advantageous to have sufficient thickness to block the source/drain implant (of the MOS devices). However, this is not required if the source/drain pattern protects the body of the poly resistor.

Photoresist layer 26 is then formed over the insulating layer 18 and patterned to form the desired geometry of the resistor body. The insulating region 18 is then etched using known etch technologies.

Figure 4A:
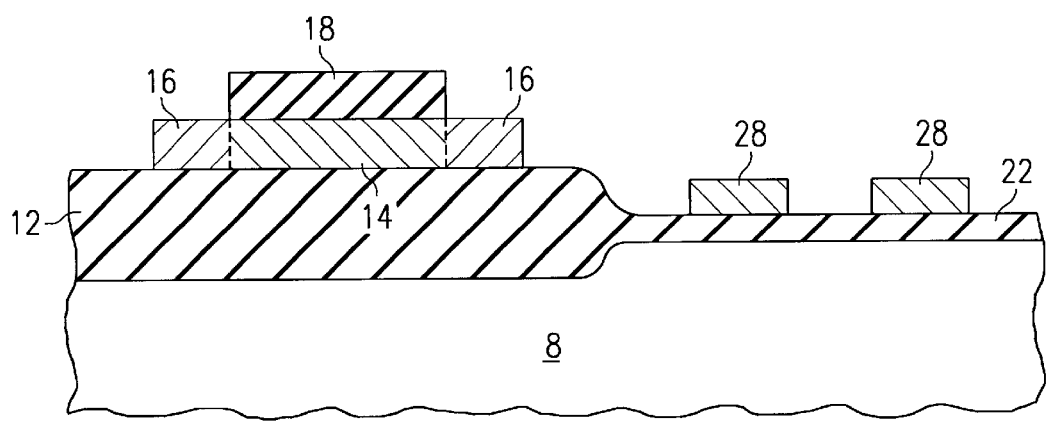

Referring now to FIG. 4a, the polysilicon layer is patterned to form the resistor including resistor heads 16 as well as other polysilicon elements 28 of other devices on the integrated circuit. For example, if the other device is a MOS device the polysilicon element 28 may be a gate or if the other device is a bipolar device the polysilicon element may be the emitter. Other polysilicon elements may also be formed. Once again, it is noted that insulating layer 22 is optional and is not included for all devices.

Figure 4B:
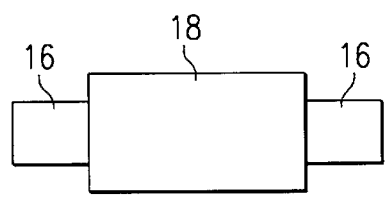
Figure 4C:
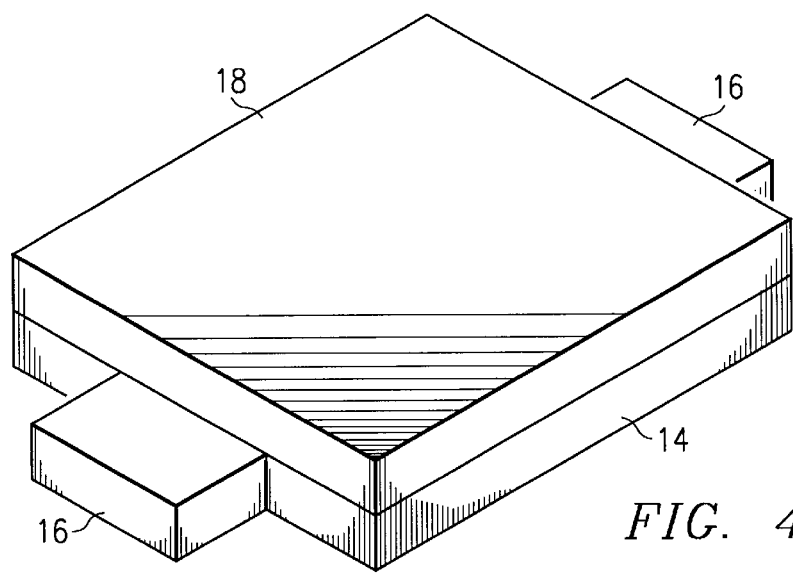

As illustrated by the top view of FIG. 4b and the side view of FIG. 4c, the resistor heads 16 may be formed at the ends of the resistor body 14. These heads may be a smaller width than the body 14 of the resistor which has a geometry defined by the insulating layer 18. One advantage of the present invention is that the resist pattern defines the heads 16 of the poly resistor at the same time that the poly emitters, CMOS gates or other components are patterned.

The polysilicon layer 24 may be further doped prior to or subsequent to patterning and etching the layer 24. The doping, possibly by ion implantation, is performed to obtain the desired conductivity of the various polysilicon elements. Typically, the same type impurity is used as was used to obtain the desired resistor sheet resistance. It should be noted the doping concentration of the polysilicon resistor body 14 will not be effected because insulating region 18 (and possibly resists layer 26 as well) will block additional dopants.

Referring now to FIG. 5, several additional steps may also be performed. These additional steps, however, are not critical to the present invention.

A screen oxide (not shown), e.g., 300 Å thick, may be deposited and patterned to create the pattern for a lightly doped drain (LDD) region of a MOSFET device. The LDD region may then be implanted.

Figure 5A:
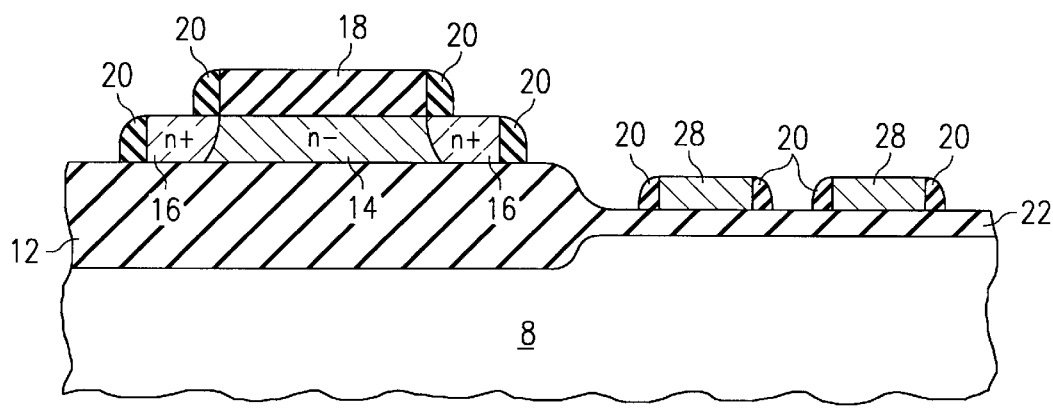
Figure 5B:
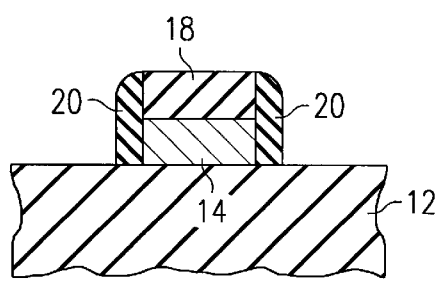
Figure 5C:
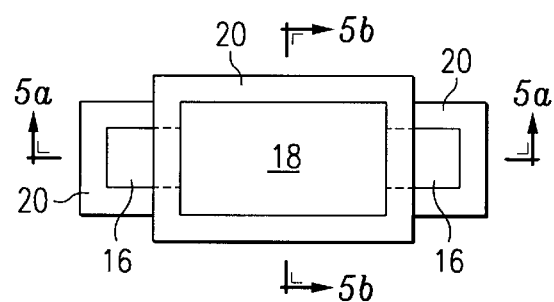

A sidewall oxide layer may then be deposited and subsequently etched to form spacers 20 on emitters, gates, resistors and other structures in the device. A cross-sectional view of the integrated circuit device is illustrated in FIG. 5a. FIG. 5b illustrates a cross section through the width of the resistor and FIG. 5c illustrates a top view of the resistor. Methods for forming sidewall spacers are known in the art.

Additional process steps as known may also be performed. For example, a screen oxide may be deposited and patterned to implant the source and drains of a MOS device. This step will also form a low resistance head on the resistor which can be contacted by local interconnect or metal.

Further, the source and drain may be annealed. If so, the heavily doped regions 16 may encroach beneath the insulating layer 18 as illustrated in FIG. 5a.

In addition, a silicide may be formed on the heads 16 of the resistor as well as other desired components. During the silicide process, the resistor body is isolated by sidewall spacers 20 and insulating layer 18 (as illustrated in FIG. 5). This isolation provides another advantage to the present method. Once again, processes for forming suicides are well known in the art.

The process described herein may be easily incorporated into standard BiCMOS processes. For example, the CMOS gate and the polysilicon emitter may be formed from the same layer of polysilicon as the resistor. In this particular case, a split poly process is used to accomplish this. However, the resistor structure described here is not limited to split poly processes or BiCMOS processes.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating a polysilicon resistor which includes a resistor body portion and at least two contact portions, said method comprising the steps of:

forming a polysilicon layer;

doping said polysilicon layer to obtain a first resistivity;

forming an insulating layer over said polysilicon layer;

removing a portion of said insulating layer such that said resistor body portion of said polysilicon layer remains beneath said insulating layer but said contact portions are exposed;

subsequent to said step of removing a portion of said insulating layer, etching said polysilicon layer to form a resistor which includes said resistor body and said at least two contact portions abutting said resistor body;

performing a second doping step wherein said two contact portions are doped without substantially affecting the doping concentration of said resistor body;

subsequent to said step of forming an insulating layer, forming a sidewall spacer along sidewalls of said resistor body and said at least two contact portions, said sidewall spacer also being formed along a sidewall of said insulating layer formed on said contact portions;

subsequent to said second doping step, forming a suicide region on said contact portions.

2. A method of forming an integrated circuit device including at least one polysilicon resistor which includes a resistor body and two contact portions, said method comprising the steps of:

forming a polysilicon layer;

doping said polysilicon layer to achieve a first sheet resistance;

forming an insulating layer over said polysilicon layer;

etching a portion of said insulating layer to define said resistor body in said polysilicon layer, said etching step exposing said two contact portions of said polysilicon layer;

subsequent to said step of removing a portion of said insulating layer, patterning and etching said polysilicon layer to define said first and second contact portions abutting said resistor body and simultaneously forming at least one polysilicon element of a second electronic device;

performing a second doping step wherein said first and second contact portions are doped without substantially affecting the doping concentration of said resistor body;

subsequent to said step of forming an insulating layer, forming a sidewall spacer along sidewalls of said two contact portions, said resistor body and said at least one polysilicon element;

subsequent to said second doping step, forming a silicide region on each of said first and second contact portions.

3. The method of claim 1 wherein said insulating layer comprises an oxide layer.

4. The method of claim 1 wherein said insulating layer comprises an nitride layer.

5. The method of claim 1 wherein said polysilicon layer is formed at least partially over a field oxide region.

6. The method of claim 1 wherein said second doping step comprises the step of heavily doping said polysilicon layer prior to etching said polysilicon layer.

7. The method of claim 1 wherein said second doping step comprises the step of heavily doping said contact portions of said polysilicon layer subsequent to etching said polysilicon layer.

8. The method of claim 1 wherein said doping steps comprise implanting an n-type impurity.

9. The method of claim 1 wherein said doping steps comprise implanting a p-type impurity.

10. The method of claim 1 wherein said doping steps include doping both n-type and p-type impurities.

11. The method of claim 2 wherein said resistor body is formed at least partially over a field oxide region.

12. The method of claim 2 and further comprising the step of forming a sidewall insulating region adjacent said polysilicon element subsequent to patterning and etching said polysilicon layer.

13. The method of claim 2 wherein said second doping step comprises the step of doping said contact portions prior to patterning and etching said polysilicon layer.

14. The method of claim 2 wherein said second doping step comprises the step of doping said contact portions subsequent to patterning and etching said polysilicon layer.

15. The method of claim 2 and further comprising the step of annealing said polysilicon layer subsequent to patterning and etching said polysilicon layer.

16. The method of claim 2 wherein said insulating layer comprises an oxide layer.

17. The method of claim 16 wherein said insulating layer comprises an oxide/nitride layer.

18. The method of claim 2 wherein said second electronic device comprises a field effect transistor.

19. The method of claim 18 wherein said at least one element comprises a field effect transistor gate.

20. The method of claim 1 said step of forming a sidewall spacer includes the step of depositing an insulating material.

21. The method of claim 2 said step of forming a sidewall spacer includes the step of depositing an insulating material.

* * * * *